US00RE40020E

(19) United States
(12) Reissued Patent
Kiko

(10) Patent Number: US RE40,020 E
(45) Date of Reissued Patent: Jan. 22, 2008

(54) IMPEDANCE BLOCKING FILTER CIRCUIT

(75) Inventor: Frederick J. Kiko, Carlsbad, CA (US)

(73) Assignee: Pulse Engineering, Inc., San Diego, CA (US)

(21) Appl. No.: 10/748,729

(22) Filed: Dec. 29, 2003

Related U.S. Patent Documents

Reissue of:
(64) Patent No.: 6,212,259
Issued: Apr. 3, 2001
Appl. No.: 09/425,778
Filed: Oct. 22, 1999

U.S. Applications:
(63) Continuation of application No. 10/408,030, filed on Apr. 3, 2003, which is a continuation-in-part of application No. 09/370,137, filed on Aug. 9, 1999, now Pat. No. 6,181,777, which is a continuation-in-part of application No. 09/195,522, filed on Nov. 19, 1998, now Pat. No. 6,188,750.

(51) Int. Cl.
*H04M 1/24* (2006.01)
*H04M 1/00* (2006.01)
*H04M 9/00* (2006.01)
*H04M 11/00* (2006.01)

(52) U.S. Cl. ..... 379/32.01; 379/8; 379/30; 379/377; 379/412

(58) Field of Classification Search ..... 379/32.01, 379/90.01, 8, 93.01, 93.05–6, 93.08–9, 342, 379/406.01, 360, 377–378, 387.01, 390.02, 379/392, 399.01, 412, 413.04
See application file for complete search history.

(56) References Cited

U.S. PATENT DOCUMENTS 4,613,732 A 9/1986 Cwirzen et al.
4,667,173 A 5/1987 Okochi
4,742,541 A 5/1988 Cwirzen et al.
4,743,999 A 5/1988 Hames
4,761,623 A 8/1988 Schneider
4,823,383 A 4/1989 Cardot et al.
5,025,443 A * 6/1991 Gupta ..... 370/494
5,077,630 A 12/1991 Bina
5,426,698 A 6/1995 Reymond
5,623,543 A 4/1997 Cook
5,627,501 A 5/1997 Biran et al.
5,642,416 A 6/1997 Hill et al.
5,726,611 A 3/1998 Takagi et al.
5,802,170 A 9/1998 Smith et al.
5,848,150 A * 12/1998 Bingel ..... 379/399.01
5,930,340 A 7/1999 Bell
6,137,866 A 10/2000 Staber et al.
6,141,377 A 10/2000 Sharper et al.
6,144,735 A 11/2000 Bella
6,418,221 B1 * 7/2002 Snow et al. ..... 379/399.01
6,477,249 B1 * 11/2002 Williamson et al. ... 379/399.01
6,552,630 B2 4/2003 Chueh et al.
6,704,397 B1 3/2004 Reusens
6,744,883 B1 * 6/2004 Bingel et al. ..... 379/399.01

* cited by examiner

*Primary Examiner*—Binh K. Tieu
(74) *Attorney, Agent, or Firm*—Gazdzinski & Associates

(57) ABSTRACT

An impedance blocking filter circuit is provided for use in telecommunication systems for interconnecting between incoming telephone lines and customer's terminal equipment so as to unconditionally block impedances above 20 KHz due to the customer's terminal equipment from an ADSL network unit and/or home networking interface unit. The filter circuit includes first, second, and third inductors connected in series between a first input terminal and a first common point. A first resistor has its one end connected also to the first common point and its other end connected to a first output terminal. Fourth, fifth and sixth inductors are connected in series between a second input terminal and a second common point. A second resistor has its one end also connected to the second common point and its other end connected to a second output terminal. A capacitor has its ends connected across the first and second common points. In other aspects, the filter circuit also includes switching means for eliminating shunt additive capacitance, correction circuit means reducing significantly return loss, and switch suppression circuit means for eliminating transients.

29 Claims, 9 Drawing Sheets

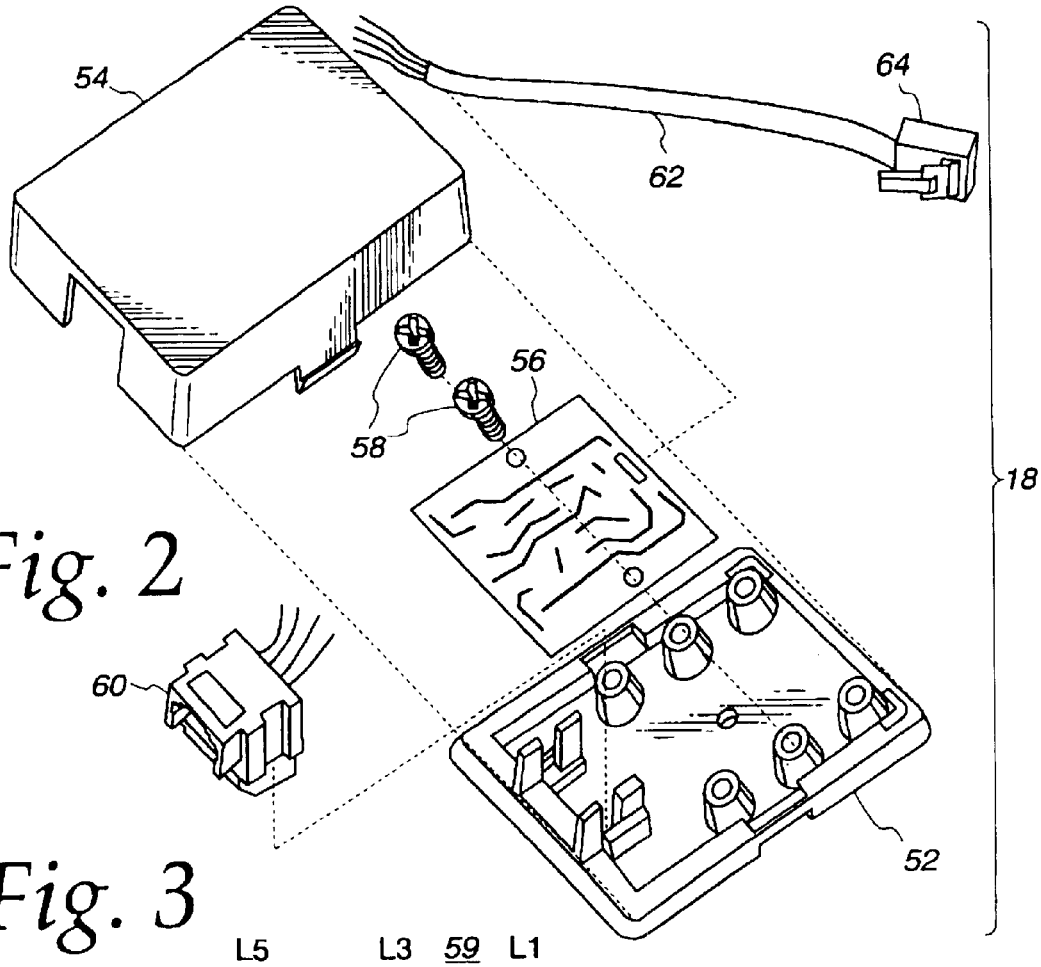
Fig. 2
Fig. 3
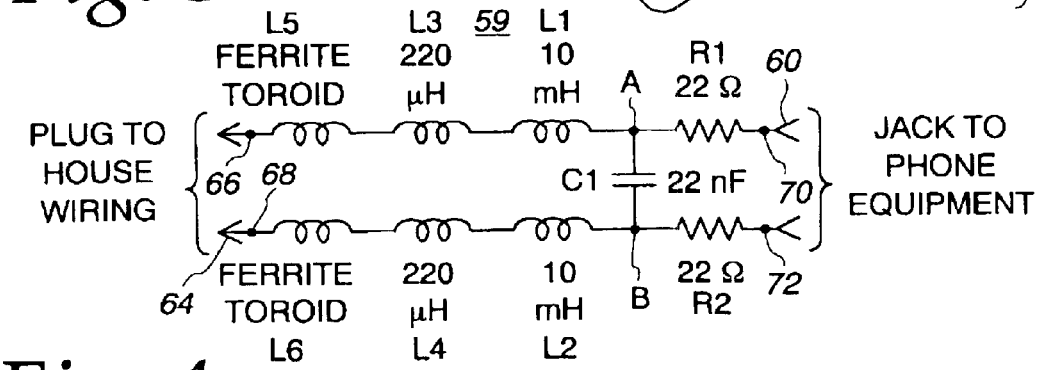
Fig. 4
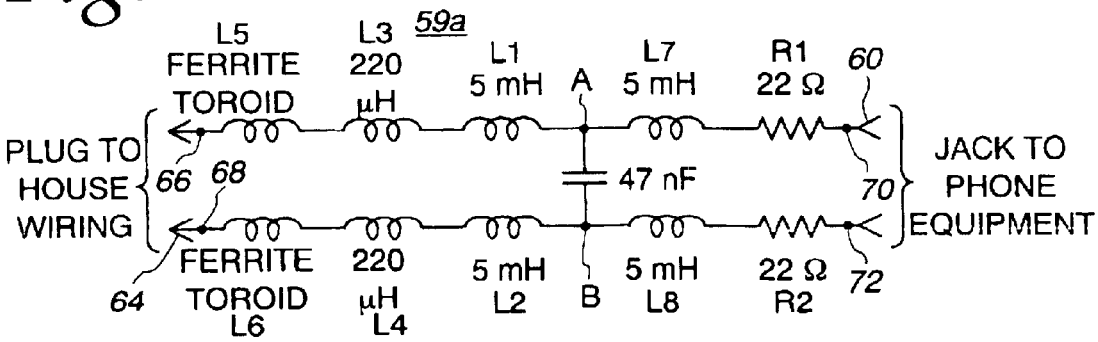

IMPEDANCE BLOCKING FILTER CIRCUIT

Matter enclosed in heavy brackets [ ] appears in the original patent but forms no part of this reissue specification; matter printed in italics indicates the additions made by reissue.

CROSS-REFERENCE TO RELATED APPLICATIONS

[The present invention is a continuation-in-part application based on prior Ser. No. 09/370,137 filed on Aug. 9, 1999, which is, in turn, a continuation-in-part application based on parent application Ser. No. 09/195,522 filed on Nov. 19, 1998, and entitled "Impedance Blocking Filter Circuit."] *The present reissue application is a continuation application of prior application Ser. No. 10/408,030 filed Apr. 3, 2003 of the same title, which is a reissue of U.S. Pat. No. 6,212,259 issued Apr. 3, 2001 of the same title, which is a continuation-in-part application based on prior Ser. No. 09/370,137 filed on Aug. 9, 1999, now U.S. Pat. No. 6,181,777, which is, in turn, a continuation-in-part application based on parent application Ser. No. 09/195,522 filed on Nov. 19, 1998, now U.S. Pat. No. 6,188,750.*

BACKGROUND OF THE INVENTION

1. Field of the Invention

This invention relates generally to telecommunication systems and more particularly, it relates to an impedance blocking filter circuit used in telecommunication systems for interconnecting between incoming telephone lines from a telephone company's central office (C.O.) and subscriber or customer telephone equipment such as a telephone set located at a subscriber's premises so as to unconditionally block telephone impedance above 20 KHz.

2. Description of the Prior Art

The prior art appears to be best exemplified in the following U.S. Letters Patent which were developed in a search directed to the subject matter in this application:

| | |
|---|---|
| 4,613,732 | 4,823,383 |
| 4,742,541 | 5,642,416 |
| 4,743,999 | 5,802,170 |

In U.S. Pat. No. 4,823,383 issued to Cardot et al. on Apr. 18, 1989, there is disclosed a protection device for terminal equipment on telephone subscriber premises which includes a voltage surge protection circuit and/or a filter for providing protection against radio frequencies and interference. The filter is comprised of series inductors L1, L2, L3 and L5 interconnected between terminals E1 and S1 and series inductors L'1, L'2, L4 and L'5 interconnected between terminals E2 and S2. A capacitor C5 is connected between the junctions of the inductors L2, L3 and the inductors L'2, L4. The surge protection circuit includes thermistors TH1, TH2 and voltage limiters D1–D3.

In U.S. Pat. No. 5,802,170 issued to Smith et al. on Sep. 1, 1998, there is disclosed a customer bridge module for connecting telephone company wiring and subscriber telephone wiring in a telephone network interface apparatus. In one embodiment, the customer bridge module includes overcurrent protection and an RFI filter. The overcurrent protection is formed by positive temperature coefficient resistors 220, 222 and inductors. The RFI filter is formed by inductors 224a–224c, 226a–226c and capacitors 236a–236c. The inductors and capacitors are used to form a multi-pole low pass filter.

In U.S. Pat. No. 5,642,416 issued to Hill et al. on Jun. 24, 1997, there is disclosed an electromagnetic interference by-pass filter which suppresses RF noise currents conducted over the tip and ring leads to a telephone line-powered instrument. The filter includes first and second inductors 51, 53 and first and second capacitors 41, 43.

It is generally well-known these days that many telephone subscribers or customers also have a personal computer located on their premises. At times, the computer user receives ADSL (an acronym for Asymmetric Digital Subscriber Line) signals from the Internet over the same telephone lines via an Internet Server Provider (ISP). In order to increase the speed of downloading of information from the Internet, an ADSL network interface is typically purchased and installed between the incoming telephone lines and the user's computer. However, since one or more telephone subscriber terminal equipment such as telephone sets, facsimile machines and/or answering devices are also connected to the same incoming telephone lines via internal house wiring, ADSL interference problems may be caused by the terminal equipment which can significantly limit or reduce the data rate. In one situation, it has been experienced that the change of state from "on-hook" to "off-hook" of the telephone equipment and sometimes the telephone terminal equipment even being "on-hook" can create a resonance effect to occur so as to drop the impedance value to less than 10 Ω(Ohms) at a frequency as high as 500 KHz.

Accordingly, it would be desirable to provide an impedance blocking filter circuit for connection to the telephone terminal equipment causing the erratic input impedances. The impedance blocking filter circuit of the present invention is of a modular design so as to be easily connected in series with the offending telephone terminal equipment. The impedance blocking filter circuit blocks unconditionally any telephone impedances (e.g., open, short, capacitive, inductive, resonant, or any combination thereof) above the frequency of 20 KHz.

SUMMARY OF THE INVENTION

Accordingly, it is a general object of the present invention to provide an impedance blocking filter circuit which effectively and efficiently eliminates ADSL interference caused by telephone terminal equipment.

It is an object of the present invention to provide an impedance blocking filter circuit for connection to telephone terminal equipment causing the erratic input impedances.

It is another object of the present invention to provide an impedance blocking filter circuit used in telecommunication systems for interconnecting between incoming telephone lines and customer's terminal equipment so as to unconditionally block impedance above 20 KHz due to the customer's terminal equipment from an ADSL network interface unit and/or home networking interface unit.

It is still another object of the present invention to provide an impedance blocking filter circuit which is of a modular design so as to be easily connected in series with the offending telephone terminal equipment.

It is still yet another object of the present invention to provide an impedance blocking filter circuit which is comprised of six inductors, two resistors, and a capacitor.

In accordance with a preferred embodiment of the present invention, there is provided an impedance blocking filter circuit used in telecommunication systems for interconnecting between incoming telephone lines and customer's terminal equipment so as to unconditionally block impedances above 20 KHz due to the customer's terminal equipment from an ADSL network interface unit and/or home networking interface unit. The filter circuit includes first, second and third inductors connected in series between a first input terminal and a first common point. The first inductor has its one end connected to one end of the second inductor. The second inductor has its other end connected to one end of the third inductor. The third inductor has its other end connected to the first common point. A first resistor has its one end also connected to the first common point and its other end connected to a first output terminal.

The filter circuit further includes fourth, fifth and sixth inductors connected in series between a second input terminal and a second common point. The fourth inductor has its one end connected to the second input terminal and its other end connected to one end of the fifth inductor. The fifth inductor has its other end connected to one end of the sixth inductor. The sixth inductor has its other end connected to the second common point. A second resistor has its one end also connected to the second common point and its other end connected to a second output terminal. A capacitor has its one end connected to the first common point and its other end connected to the second common point.

The foregoing applies specifically to the disclosure of the parent application Ser. No. 09/195,522. A third embodiment of an impedance blocking filter circuit of the present invention added by way of this continuation-in-part application is quite similar to the schematic diagram of FIG. 3, except that the filter circuit therein has been modified so that the resistors R1 and R2 are replaced with first and second tank circuits TC1 and TC2, respectively and a reed switch K1 is connected in series with the capacitor C1. As a result, this third embodiment represents an improvement over the embodiment of FIG. 3 since it overcomes the shunt additive capacitance problem and eliminates the deterioration in the return loss at the phone.

In addition, a fourth embodiment of an impedance blocking filter circuit of the present invention also added by way of this continuation-in-part application includes all of the components of the third embodiment and further has added successively seventh and eight inductors L7, L8; a second capacitor C2 and a second reed switch K2 connected in series; and ninth and tenth inductors L9, L10.

In a fifth embodiment, there is provided an impedance blocking filter circuit which is quite similar to the schematic circuit diagram of FIG. 3, except that the filter circuit therein has been modified so to eliminate the resistors R1 and R2 and a reed switch K1 is connected in series with the capacitor C1. The four inductors L1–L4 and the reed switch K1 are all housed within a multi-sectioned bobbin structure so to significantly reduce interwinding capacitance.

In a sixth embodiment, there is provided an impedance blocking filter circuit which includes all of the components of the fifth embodiment and further has added successively seventh and eight inductors L7,L8; a second capacitor C2 and a second reed switch K2 connected in series; and ninth and tenth inductors L9,L10. The second reed switch K2 is also housed within the multi-sectioned bobbin structure.

A seventh embodiment of an impedance blocking filter circuit of the present invention is added by way of this second continuation-in-part application which is quite similiar to the filter circuit of FIG. 9, except that the filter circuit thereof has been modified to include an inductor L13 interconnected between the inductor L1 and the common point A; an inductor L14 interconnected between the inductor L2 and the common point B; and a capacitor C5 connected across the inductors L1,L2. As a consequence, this seventh embodiment represents an improvement over the embodiment of FIG. 9 since it suppresses switching transients from affecting the line side of the house wiring going to the ADSL modem.

Further, an eighth embodiment of an impedance blocking filter circuit of the present invention also added by way of this second continuation-in-part is substantially identical to the third-order filter circuit of FIG. 9, except that the filter circuit thereof has been modified so that the reed switches K1, K2; capacitors C1, C2; and varistors D1, D2 are replaced with a pair of transistors Q1, Q2; resistor R5; capacitors C5, C6; and varistors D3, D4. In addition, the inductors L5, L6 of FIG. 9 have been eliminated.

In a ninth embodiment, there is provided an impedance blocking filter circuit which is quite similar to the schematic circuit diagram of FIG. 12, except that the filter circuit therein has been modified so as to include an inductor L13 interconnected between the inductor winding TW and the common point A; an inductor L14 interconnected between the inductor winding RW and the common point B; and a capacitor C5 connected across the inductor windings TW and RW. The inductors L5 and L6 of FIG. 12 have been eliminated.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 2 is an exploded, perspective view of one form of a module housing the impedance blocking filter circuit;

FIG. 3 is a schematic circuit diagram of an impedance blocking filter circuit, constructed in accordance with the principles of the present invention;

FIG. 4 is a schematic circuit diagram of a second embodiment of an impedance blocking filter circuit, in accordance with the principles of the present invention;

DESCRIPTION OF THE PREFERRED EMBODIMENT

Figure 1:
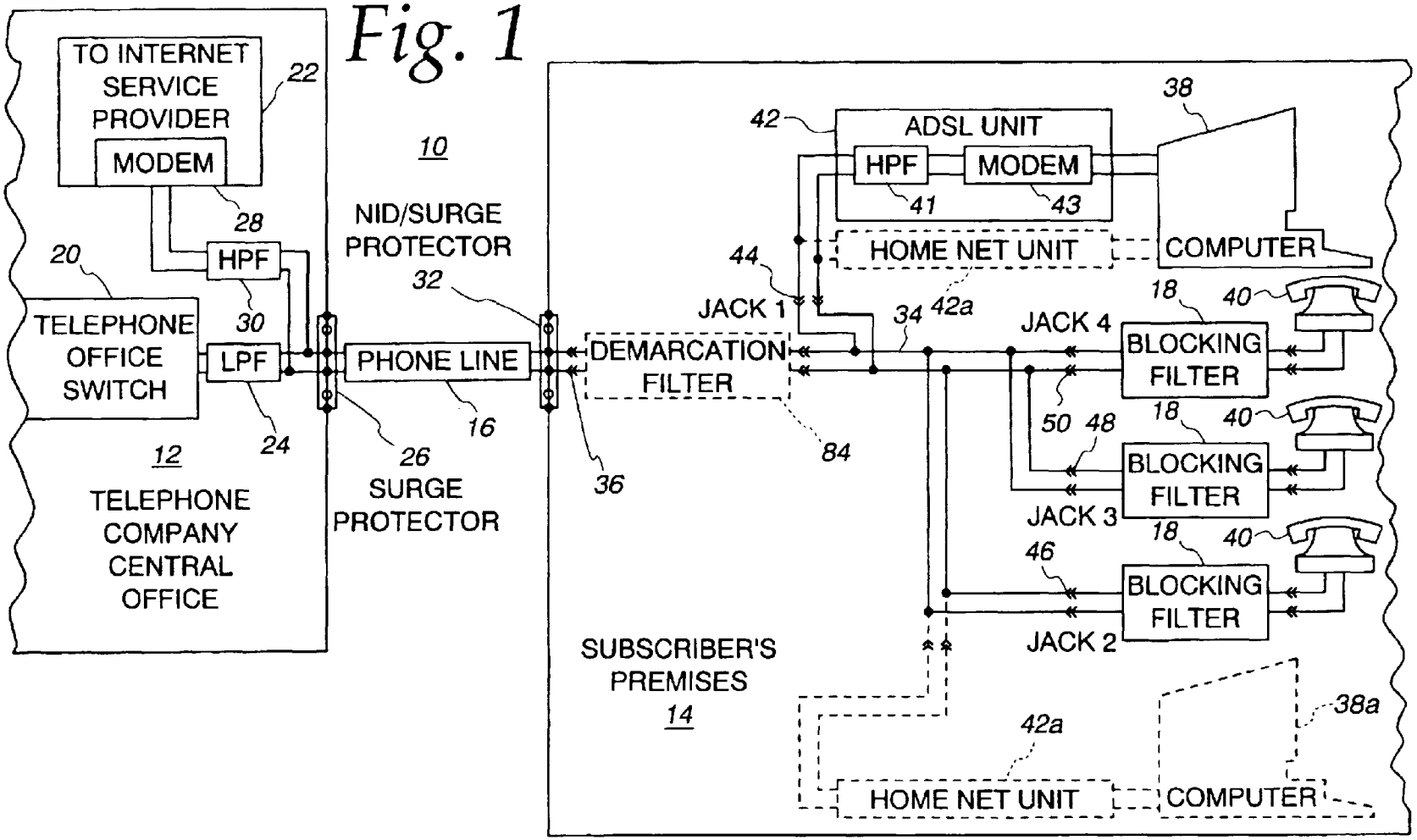
FIG. 1 is an overall block diagram of a telecommunication system for interconnecting a central office and a subscriber's premises, employing an impedance blocking filter circuit of the present invention.

Referring now in detail to the drawings, there is illustrated in FIG. 1 an overall block diagram of a telecommunication system 10 for interconnecting a telephone company's central office (CO) 12 and a subscriber's premises 14 over a transmission media such as a conventional twisted pair of telephone lines 16. The telecommunication system 10 employs a plurality of impedance blocking filter circuits, constructed in accordance with the principles of the present invention, in which each is contained in a modular housing 18.

The central office 12 includes a telephone office switch 20 and an Internet Service Provider (ISP) 22. The telephone office switch 20 is used to send voice signals via a low-pass filter 24 and a surge protector 26 to the telephone line 16. The ISP 22 transmits ADSL data signals to a modem 28 which are then sent to the telephone lines 16 via a high-pass filter 30 and the surge protector 26. It should be understood that the voice signals from the telephone office switch 20 and the ADSL data signals from the ISP 22 can be transmitted simultaneously to the telephone lines 16. Further, the voice signals (speech) are in the frequency band between 300 and 3400 Hz, and the ADSL data signals are in the frequency band between 20 KHz and 1.1 KHz.

The subscriber's premises 14 includes a Network Interface Device (NID)/surge protector unit 32 which is connected to the incoming telephone lines 16 on its input side and is connected to the subscriber's internal wiring or house wiring 34 on its output side via a demarcation RJ-11 jack and plug unit 36. As can be seen, the subscriber's premises further includes a number of terminal equipment such as a plurality of telephone sets 40. At times, the computer user will be downloading information to a personal computer 38 from the Internet by receiving ADSL data signals transmitted by the ISP 22.

In order to optimize the downloading of this information from the Internet, the user can purchase and install an ADSL network interface unit 42 for connection between the computer 38 and a RJ-11 jack and plug unit 44. The ADSL network interface unit 42 includes a high-pass filter 41 connected to the RJ-11 unit 44 and an internal modem 43 connected to the computer 38. The RJ-11 unit 44 is connected to the house wiring 34 for receiving the ADSL signals from the telephone lines 16. However, it will be observed that the plurality of telephone sets 40 are also connected to the same house wiring 40 via RJ-11 units 46, 48 and 50, respectively.

If it were not for the impedance blocking filter circuits 18 in the present invention, the output impedance from each of the telephone sets 40 would be connected in parallel with the input impedance of the ADSL unit 42. Since the output impedances from the telephone sets are subject to wide variations due to, for example, changing from "on-hook" to "off-hook" so as to present either an open, a short, capacitive, inductive, resonant, or any combination thereof at frequencies above 20 KHz, this erratic impedance can significantly affect the rate of the ADSL data signals being received by the computer 38 via the ADSL network interface unit 42.

Therefore, the main purpose of the impedance blocking filter circuit of the present invention is to isolate the terminal equipment (telephone sets) impedances from the ADSL unit 42 and the house wiring 34 so as to eliminate degradation of the performance of the ADSL unit 42. Further, the impedance blocking filter circuit serves to attenuate the ADSL data signal from being received by the telephone sets 40 in order to prevent non-linear conversion to voice band signals. Moreover, to facilitate the installation required by the customer, the filter circuit is contained in the modular housing 18.

As can best be seen from FIG. 2, one form of the modular housing 18 includes a base 52 and a snap-on removable cover 54. The base has a printed circuit board 56 which is fixedly secured thereto by screws 58 and has mounted thereon the electrical circuit components for the filter circuit 59. One end of the modular housing 18 has a RJ-11 jack 60 formed integrally therewith for connection to the telephone set. This connection is achieved by plugging a RJ-11 plug (not shown) from a telephone set into the jack 60. The other end of the modular housing 18 has a short length of cable 62 extending therefrom and terminating in a RJ-11 plug 64 which is connectable to the house wiring. In particular, the plug 64 is connected to the house wiring 34 by plugging the same into a wall socket (not shown) having a RJ-11 jack.

In FIG. 3, there is shown a detailed schematic circuit diagram of the impedance blocking filter circuit 59 of the present invention for connection in series between the house wiring 34 and the terminal equipment (telephone set) of FIG. 1. The filter circuit 59 includes two input (tip and ring) terminals 66, 68 which are connectable to the house wiring 34 via the RJ-11 plug 64 and two output (tip and ring) terminals 70, 72 which are connectable to the telephone set 40 via the RJ-11 jack 60. The filter circuit 59 is comprised of inductors L1–L6, a capacitor C1, and a resistor R1, R2.

The inductors L5, L3, L1 and the resistor R1 are connected in series between the first or tip input terminal 66 and the first or tip output terminal 70. Similarly, the inductors L6, L4, L2 and the resistor R2 are connected in series between the second or ring input terminal 68 and the second or ring output terminal 72. The inductors L5 and L6 are each preferably formed of a ferrite toroid. The inductors L3 and L4 have the same inductance values, and the inductors L1 and L2 have the same inductance values. The inductors L1 and the first resistor R1 are connected together at a common point A and to one side of the capacitor C1. The inductor L2 and the second resistor R2 are connected together at a common point B and to the other side of the capacitor C1. The resistors R1 and R2 also have the same values.

As previously pointed out, the primary purpose of the impedance blocking filter circuit 59 is to block the impedances from the telephone set at above the frequency of 20 KHz from reaching the house wiring 34, thereby preventing adverse performance of the ADSL network unit 42 (FIG. 1). In particular, the ADSL data signals being in the frequency range of 20 KHz and 1.1 MHz are mainly blocked by the inductors L1 and L2. However, it has been experienced that some telephone sets have an input capacitance of less than 5 nf which can cause resonant impedances to occur within the ADSL band. In order to eliminate this undesirable effect, the capacitor C1 is used to lower any resonance into an acceptable dead band at around the 10 KHz frequency. Further, the capacitor C1 also provides additional attenuation of the ADSL signals so as to prevent driving the telephone impedance into a non-linear region and converting the high frequency ADSL signals into audible signals which can be heard by the subscriber or converted to another ADSL band and cause ADSL interference. While they may still exist other minor resonances in the telephone set in the frequency range of between 20 KHz and 60 KHz, their undesirable effect is significantly reduced by the resistors R1 and R2 which produce a de-Q effect. It should be noted that the inductors L1 and L2 are formed as separate inductors so as to avoid longitudinal impedance problems as well as blocking differential impedances.

Since the inductors L1 and L2 have their own frequency limitations (e.g., self-resonant frequency), the inductors L3 and L4 are provided so as to block the telephone impedances in the frequency band of 1 MHz to 20 MHz. These inductors L3, L4 are necessary when phoneline home networking interface units (FIG. 1) are being used in conjunction with the ADSL network interface unit 42, as will be explained hereinafter. The inductors L5 and L6 are provided so as to block the telephone set impedances in the frequency band of 20 MHz to 500 MHz, which will prevent any problems caused by TV/FM interference.

For completeness in the disclosure of the above-noted filter circuit but not for purposes of limitation, the following representative values and component identifications are submitted. These values and components were employed in a filter circuit that was constructed and tested, and which provides high quality performance.

| PART | TYPE or VALUE |
|---|---|
| L1, L2 | 10 mH |
| L3, L4 | 220 μH |
| L5, L6 | ferrite toroid, 75 μH |
| C1 | 20 nf |
| R1, R2 | 22 Ω |

Figure 5:
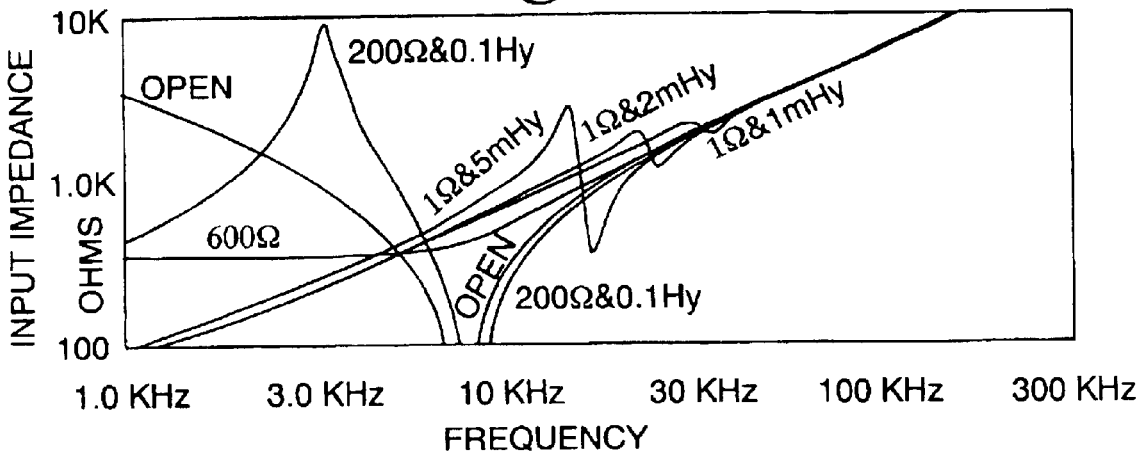
FIG. 5 is a plot of input impedance of the impedance blocking filter circuit of FIG. 3 for various telephone equipment impedances as a function of frequency.

With these above values being used, the input impedance of the impedance blocking filter circuit 59 was plotted for various telephone equipment impedances (e.g., open, short, capacitive, inductive, resonant, or a combination of these conditions) as a function of frequency and is illustrated in FIG. 5. As can be seen from the various curves, the input impedance across the input terminals 66, 68 of the impedance blocking filter circuit 59 for any telephone impedances connected across its output terminals 70, 72 is equal to or greater than 2 K Ohms at frequencies above 40 KHz.

The impedance blocking filter circuit 59 of FIG. 3 is basically a second-order filter and has been found to minimize adequately voice band transmission effects when up to eight (8) filter circuits are installed into the telecommunication system of FIG. 1. In order to provide higher attenuation at frequencies above 20 KHz, there is shown in FIG. 4 a schematic circuit diagram of a second embodiment of a third-order impedance blocking filter circuit 59a of the present invention. The third-order filter circuit of FIG. 4 is substantially identical to the second-order filter circuit of FIG. 3, except there has been added an inductor L7 and an inductor L8. The inductor L7 is interconnected between the common point A and the first resistor R1, and the inductor L8 is connected between the common point B and the second resistor R2. The inductors L7 and L8 have the same inductance values.

Based upon tests connected on the third-order filter circuit of FIG. 4, it was observed that higher attenuation was provided at frequencies above 20 KHz. However, it was found that the number of such third-order filter circuits which could be connected to the telecommunication system of FIG. 1 was limited to three or four. This is due to the fact that the inductor values of L1, L2, L7 and L8 of FIG. 4 are smaller (on the order of 5–10 mH) than the ones in FIG. 3, the capacitor value of C1 of FIG. 4 is larger (on the order of 33–47 nf) than the one in FIG. 3, and the additive capacitive loading caused by each added filter circuit will adversely affect the voice band performance. Thus, the optimized operation between voice performance and ADSL performance was found to exist when only three or four filter circuits 59a were installed.

While the filter circuit of FIG. 3 performed adequately, the inventor has found based upon further testing that a transient problem will occur when the telephone set goes "off-hook" at the peak of the ring signal. This "off-hook" transient condition may cause current spikes to occur which are higher than 600 mA. As a result, the high current will tend to saturate the inductors, thereby momentarily lowering the input impedance of the filter circuit and thus adversely affects the data on the ADSL signal being transmitted to the interface unit 42.

Figure 6:
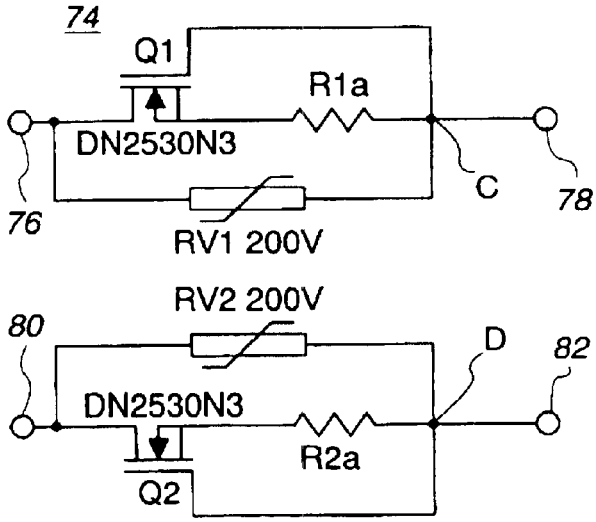
FIG. 6 is a schematic circuit diagram of current limiting protection circuitry for use with the filter circuit of FIG. 3.

In order to overcome this current transient problem, the inventors have developed fast current limiting protection circuitry 74 for providing protection against the "off-hook" transients. In FIG. 6 of the drawings, there is shown a schematic circuit diagram of the current limiting protection circuitry 74 which is comprised of depletion mode N-channel field-effect transistors (FET) Q1, Q2; resistors R1a, R2a; and varistors RV1, RV2. The FET Q1 has its drain electrode connected to a first input terminal 76, its source electrode connected to one end of the resistor R1a, and its gate electrode connected to the other end of the resistor R1a. The common point C of the gate electrode of the transistor Q1 and the resistor R1a is also joined to the first output terminal 78. Similarly, the FET Q2 has its drain connected to a second input terminal 80, its source connected to one end of the resistor R2a, and its gate electrode connected to the other end of the resistor R2a. The common point D of the gate of the transistor Q2 and the resistor R2a is also joined to a second output terminal 82. One end of the varistor RV1 is connected to the drain of the transistor Q1, and the other end thereof is connected to the common point C. One end of the varistor RV2 is connected to the drain of the transistor Q2, and the other end thereof is connected to the common point D.

In use, the current limiting protection circuitry 74 replaces the resistors R1 and R2 of FIG. 3. The first and second input terminals 76, 80 of the protection circuitry 74 are connectable to the common points A and B of FIG. 3, and the first and second output terminals 78, 82 thereof are connected to the tip and ring output terminals 70, 72 of FIG. 3. The transistors Q1, Q2 may be similar to the ones commercially available from Supertex Corporation under their Part No. DN2530N3. The varistors may be similar to the type ZNR which are manufactured and sold by Panasonic Corporation. The resistors R1a and R2a have the same resistance value and are on the order of 5–20 Ohms depending on the thresholds of the transistors Q1, Q2. It should be understood that the transistors Q1, Q2 have a large tolerance on current limit and the resistors R1a, R2a permit the desired current limit value to be adjusted. Alternatively, the resistors R1a, R2a may have a value of zero Ohms or be entirely eliminated.

In normal on-hook operation, the transistors Q1 and Q2 are rendered conductive and have an on-resistance value of about 10 Ohms. When the telephone set goes "off-hook" into high ringing voltage, the gate-to-source voltage of the forward conducting FET will become more negative due to the resistors R1a, R2a. As a result, the resistance of the transistors Q1, Q2 will go very high which will limit the current spikes to approximately 70–100 mA. The transistor Q1 serves to limit the current flowing in a first direction, and the transistor Q2 serves to limit the current flow in a reverse direction. Further, the varistors RV1, RV2 defining transient protection means function to clamp transients caused by lightning and power shorts from damaging or destroying the FETs Q1, Q2.

In view of continuing increased use of home computers and the high demand for accessing of information from the Internet in the last decade or so, many of the subscribers will be multi-PC homes. As shown in FIG. 1, the subscriber's premises or small business will typically have a second computer 38a also connected to the same internal house wiring 34. In order to effect high-speed data transfer in the multi-PC environment, there will be required phoneline home networking interface units 42a for using the internal house wiring in the frequency band above 5 MHz so as to interconnect the multiple computers 38, 38a or other devices at data rates above 10 MB/s as illustrated. While the impedance filter circuit of the present invention adequately filters and blocks the telephone impedances from the home networking signals, which are in the frequency band of 5–10 MHz, it will be noted that the home networking signals from the telephone company's C.O. are however still connected to the house wiring via the NID/surge protector unit 32.

Figure 7:
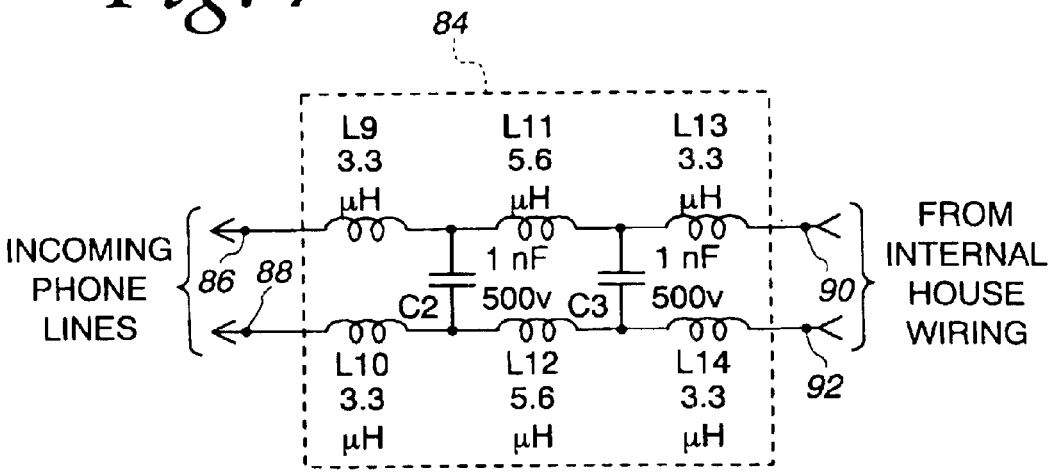
FIG. 7 is a schematic circuit diagram of a home network demarcation filter for use with the filter circuit of FIG. 3.

In order to solve this problem, the inventor has developed a home network demarcation filter 84 as shown in dotted lines in FIG. 1 for connection at a point of demarcation (NID/surge protector unit 32) between the telephone company's incoming lines 16 and the subscriber's internal house wiring 34 via the demarcation unit 36. A schematic circuit diagram of the home network demarcation network is depicted in FIG. 7. The demarcation filter 84 includes two input (tip and ring) terminals 86, 88 which are connectable to the incoming lines via the jack side of the demarcation unit 36 in the NID/surge protector unit 32 and two output (tip and ring) terminals 90, 92 which are connectable to the internal house wiring via the plug side of the demarcation unit 36. The demarcation filter is comprised of six inductors L9–L14 and two capacitors C2, C3. In use, the demarcation filter is transparent to the ADSL data signals having the frequencies between 30 KHz and 2 MHz but will produce an attenuation of more than 40 dB for frequencies above 5 MHz. The demarcation filter will also provide an inductive input impedance for above 5 MHz frequency band so as to prevent loading down the home networking signals on the incoming phone lines and also adds data security benefits.

From the foregoing detailed description, it can thus be seen that the present invention provides an impedance blocking filter circuit used in telecommunication systems for interconnecting between incoming telephone lines and customer's terminal equipment so as to unconditionally block impedances above 20 KHz due to the customer's terminal equipment from an ADSL network interface unit and/or home networking interface unit. The impedance blocking filter circuit is comprised of six inductors, two resistors, and a capacitor.

While the second-order impedance blocking filter 59 of FIG. 3 and the third-order impedance blocking filter 59a of FIG. 4 both perform adequately for unconditionally blocking telephone impedances above 20 KHz, the inventor has found that based upon additional testing they suffer from the disadvantages of causing (1) a shunt additive capacitance problem and (2) a deterioration in the return loss at a phone set, when the number of such filter circuits are added increasingly in parallel into the telecommunication system of FIG. 1.

The shunt capacitance problem is caused by the added capacitance from all of the filter circuits connected to the on-hook phones. The return loss problem is due to the fact that the series inductances of the impedance blocking filter circuit connected to the telephone set going "off-hook" will cause a resonance to occur in the frequency range of 2–5 KHz with the total capacitance seen, which is equal to the sum of the line capacitance plus the capacitance from the filter circuits. Further, as the total capacitance is increased this will also cause a lower resonant frequency which will create a phase shift so as to unbalance the telephone hybrid. As a result, the side tone level of the "off-hook" telephone set to increase.

Figure 8:
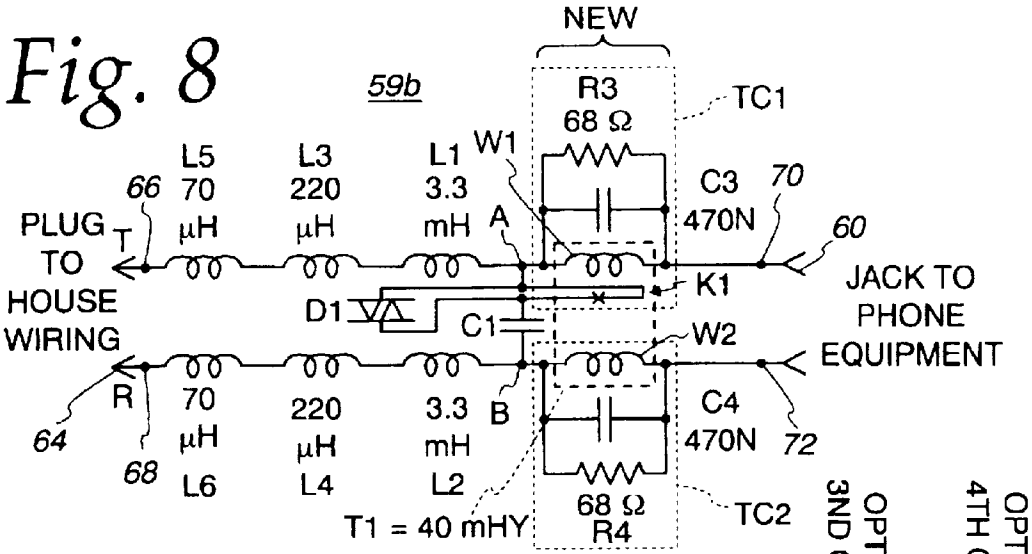
FIG. 8 is a schematic circuit diagram of a third embodiment of an impedance blocking filter circuit in accordance with the present invention.

In order to overcome this problem, there is provided in FIG. 8 a third embodiment of a second-order impedance blocking filter circuit 59b of the present invention. The third embodiment includes all of the circuit elements used in the filter circuit of FIG. 3, except for the resistors R1 and R2, and further includes a reed switch K1 and a return loss correction circuit consisting of a first tank circuit TC1 and a second tank circuit TC2.

In particular, the reed switch K1 connected in series with the capacitance C1 is connected between the common points A and B. Further, the first tank circuit TC1 is comprised of a first winding inductor W1, a capacitor C3, and a resistor R3 all connected together in parallel and between the common point A and the output tip terminal 70. Similarly, the second tank circuit TC2 is comprised of a second winding inductor W2, a capacitor C4, and a resistor R4 all connected together in parallel and between the common point B and the output ring terminal 72. In addition, there provided optionally a metal-oxide varistor D1 connected in series with the capacitor C1 and in parallel with the reed switch K1. The varistor D1 serves to protect the capacitor C1 from being damaged by transients when the telephone set is in the on-hook condition.

In use, when a telephone set goes "off-hook" DC loop current will flow which creates a DC magnetic field in the first and second winding inductors W1,W2. This will cause only the reed switch K1 of the filter circuit 59b connected to the "off-hook" telephone set to become actuated or closed by the DC magnetic field. As a consequence, the shunt additive capacitances from all of the filter circuits connected to the "on-hook" phones have been eliminated.

Moreover, the first winding inductor W1 and the capacitor C3 of the first tank circuit TC1 will cause a resonance to occur at the frequency of about 2 KHz. The impedance of the first tank circuit TC1 above the resonant frequency will appear as a capacitive reactance, which will substantially cancel the inductive reactance of the filter circuit 59b. The resistor R3 sets the Q or the slope of the resistance so as to best match the effects of the inductive impedance of the filter circuit. In this manner, the return loss at the "off-hook" phone set is significantly reduced, thereby increasing the side tone level of the telephone set. Similarly, the second winding inductor W2, the capacitance C4, and the resistor R4 of the second tank circuit TC2 operate in an identical manner to first winding inductor W1, the capacitor C3, and the resistor R3 of the first tank circuit TC1.

Figure 9:
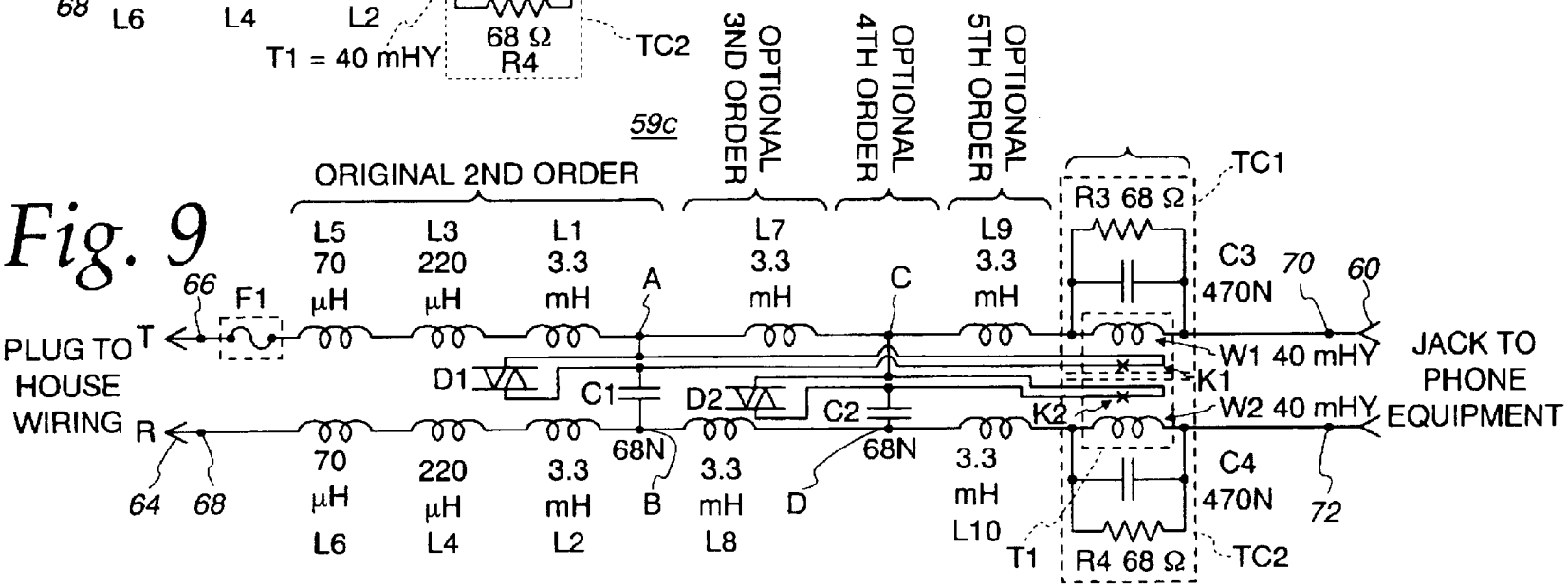
FIG. 9 is schematic circuit diagram of a fourth embodiment of an impedance blocking filter circuit in accordance with the present invention.

In FIG. 9, there is illustrated a fourth embodiment of an impedance blocking filter circuit 59c of the present invention. The fourth embodiment includes all of the circuit components of the filter circuit 59c of FIG. 8 and has added an inductor L7 and an inductor L8. The inductor L7 is interconnected between the common point A and the first tank circuit TC1, and the inductor L8 is interconnected between the common point B and the second tank circuit TC2. The filter circuit 59c as described thus far is essentially a third-order filter circuit which provides a better stop band performance than the second-order filter circuit 59b of FIG. 8.

Referring still to FIG. 9, a second reed switch K2 and a capacitor C2 have been successively added to convert the third-order filter circuit to a fourth-order filter circuit which is optimized for better operation for full rate ADSL modems. In particular, the reed switch K2 connected in series with the capacitor C2 is joined between common points C and D. In addition, there is provided optionally a metal-oxide varistor D2 connected in series with the capacitor C2 and in parallel with the reed switch K2. Likewise, the varistor D2 is used to protect the capacitor C2 from being destroyed by transients when the telephone set is in the on-hook condition.

Further, an inductor L9 and an inductor L10 are added successively so as to produce a fifth-order filter circuit. Specifically, the inductor L9 is interconnected between the inductor L7 at the common point C and the first tank circuit TC1. The inductor L10 is interconnected between the inductor L8 at the common point D and the second tank circuit TC2.

In addition, a thermo-fuser F1 may be optionally connected in series the inductors L5, L3, L1, L7, L9 and the tank circuit TC1 which are arranged between the input tip terminal 66 and the output tip terminal 70. For example, the thermo-fuse F1 may be electrically interconnected between the input tip terminal 68 and the inductor L5. Typically, the thermo-fuse F1 is located physically adjacent to on e the inductors or the resistor in order to sense the highest temperature within the filter circuit. The fuse F1 provides a safety feature and will open when the sensed temperature of the filter circuit exceed a specified trip temperature. The fuse functions as a safety protection means for preventing the filter circuit from overheating and causing a fire due to a power cross on the phone lines.

Figure 10A:
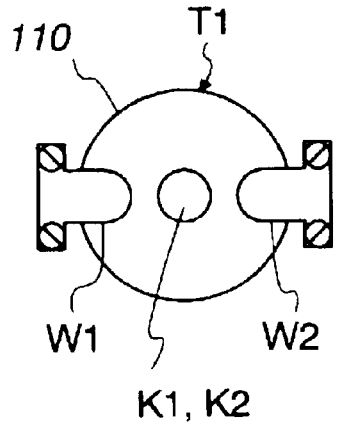
FIG. 10(a) is a top plan view of a dual winding inductor device housing one or two reed switches for use in the filter circuits of FIGS. 8 and 9.
Figure 10B:
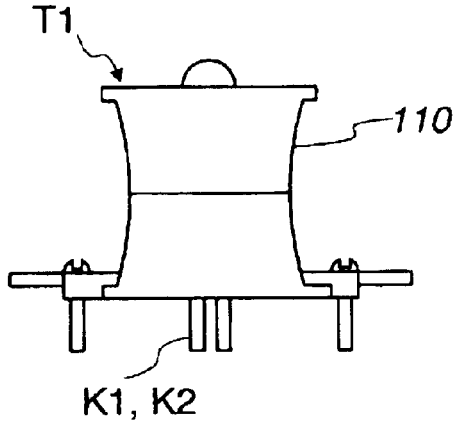
FIG. 10(b) is a side elevational view of the dual winding inductor device of FIG. 10(a)

In FIG. 10(a), there is shown a top plan view of a dual winding inductor device T1 for use in the filter circuits of FIGS. 8 and 9. FIG. 10(b) is a side elevational view of the dual winding inductor device. As can be seen, inductor device T1 includes a cylindrical-shaped housing 110 which contains the first winding inductor W1 of the first tank circuit TC1, the second winding inductor W2 of the second tank circuit TC2, the reed switch K1, and the reed switch K2.

Figure 11A:
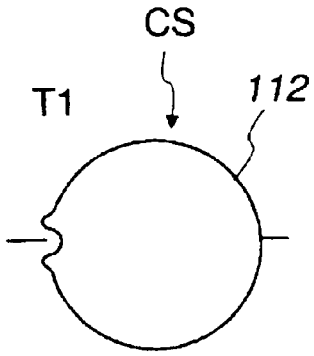
FIG. 11(a) is a top plan view of a current sensor unit for housing a single inductor and a single reed switch for alternate use in the filter circuits of FIGS. 8 and 9.
Figure 11B:
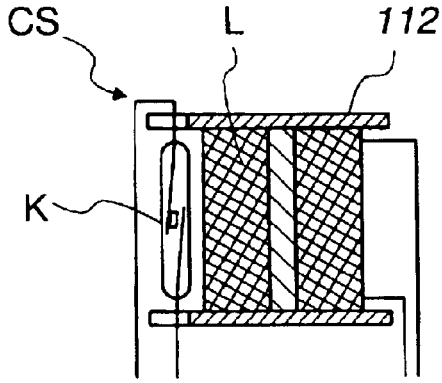
FIG. 11(b) is a side elevational view of the current sensor unit of FIG. 11(a)

In FIG. 11(a), there is depicted a top plan view of a current sensor unit CS for use in the filter circuits of FIGS. 8 and 9. FIG. 11(b) is a side elevational view of the current sensor unit CS. The current sensor unit CS is formed of cylindrical housing 112 and contains a single inductor L and a single reed switch K. It should be apparent to those skilled in the art that the dual winding inductor device T1 can be replaced with two such current sensor units CS so as to render the same operation. Since the windings W1,W2 or the inductor L is used the reed switches K1,K2 (K), the reed switch is selected to be actuable on a loop current threshold of approximately 14–20 mA. If the loop current threshold is below 14 mA, the reed switch may chatter during ringing on a 1 REN telephone and may thus shorten the useful life of the reed switch. On the other hand, if the loop current threshold is above 20 mA, then the amount of loop current may be insufficient to be actuable in the worst case condition (e.g., the longest cable).

Figure 12:
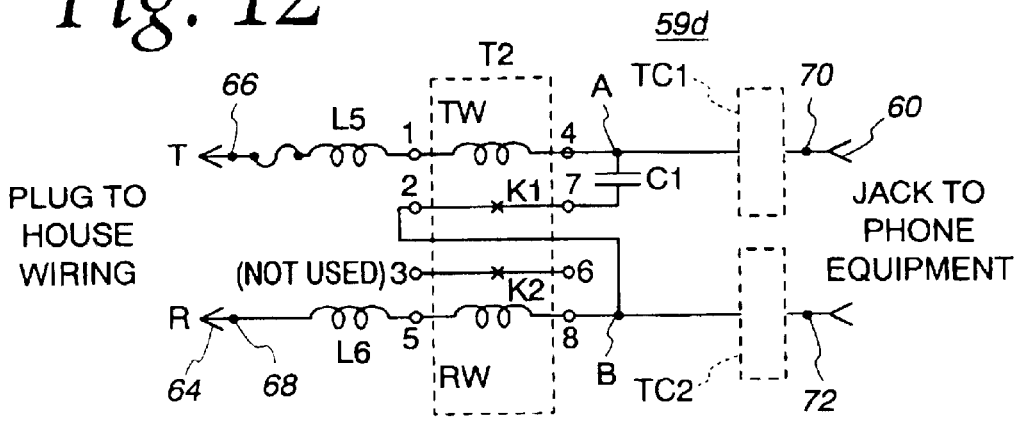
FIG. 12 is a schematic circuit diagram of a fifth embodiment of an impedance blocking filter circuit utilizing a multi-sectioned bobbin structure.

In FIG. 12, there is illustrated a fifth embodiment of an impedance blocking filter circuit 59d of the present invention. The fifth embodiment is substantially identical to the first embodiment of the second-order filter circuit of FIG. 3, except that the resistors R1 and R2 have been eliminated and a reed switch K1 has been added in series with the capacitor C1 located between the common points A and B. Further, the four single inductors L1, L2 and L3, L4 of FIG. 3 have replace by a multi-sectioned bobbins structure T2. It will be noted that the bobbin structure T2 includes a tip winding TW (corresponding to inductors L1,L2) connected between the inductor L5 and the common point A, and a ring winding RW (corresponding to inductors L3,L4) connected between the inductor L6 and the common point B. Further, the bobbin structure T2 houses the reed switches K1,K2. The tip(ring) winging TW(RW) combines the inductor L1(L2) for the ADSL frequency band (30 KHz to 2 MHz) and the inductor L3(L4) for the mid-frequency band (1 MHz to 20 MHz) into a single coil. It has been found that the filter circuit 59d is more economical to manufacture and assemble, but yet eliminates the shunt additive capacitance problem of the filter circuits connected the "on-hook" phone sets. Optionally, a return loss correction circuit consisting of a first tank circuit TC1 and a second tank circuit TC2 may be interconnected between the common points A,B and the output terminals 70,72.

Figure 13:
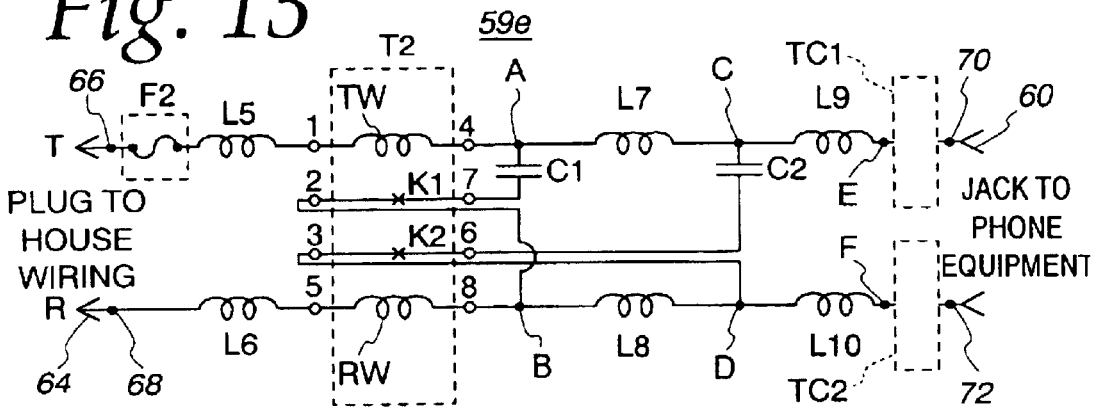
FIG. 13 is a schematic circuit diagram of a sixth embodiment of an impedance blocking filter circuit utilizing a multi-sectioned bobbin structure.

In FIG. 13, there is shown a sixth embodiment of an impedance filter circuit 59e of the present invention. The sixth embodiment includes all of the circuit components of the filter circuit 59d of FIG. 12 and has added an inductor L7 and an inductor L8. The inductor L7 is interconnected between the common point A and the output tip terminal 70, and the inductor L8 is interconnected between the common point B and the output ring terminal 72. The filter circuit thus far described is essentially a third-order filter circuit for producing a better stop band.

Referring still to FIG. 13, a second reed switch K2 and a second capacitor C2 have been further added so as to convert the third-order filter circuit to a fourth-order filter circuit which is optimized for better operation for full rate ADSL modems. In particular, the second reed switch K2 connected in series with the second capacitor C2 are joined between nodes C and D. It will be noted that the second reed switch K2 is also incorporated into the bobbin structure T2. Further, an inductor L9 is added between the inductor L7 and the node E, and an inductor L10 is added between the inductor L8 and the node F in order to convert the fourth-order filter circuit to a fifth-order filter circuit.

Figure 14A:
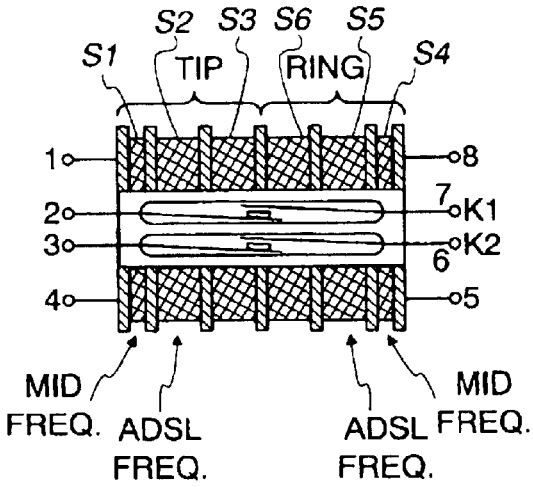
FIG. 14(a) is a side view of a multi-sectioned bobbin structure for use in the filter circuits of FIGS. 12 and 13.
Figure 14B:
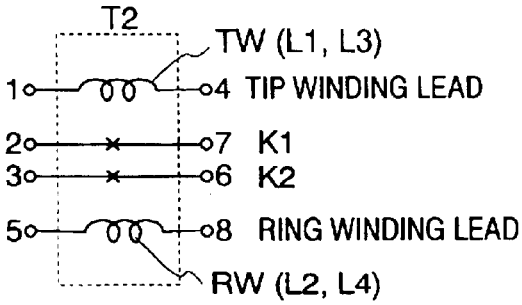
FIG. 14(b) is schematic diagram of the multi-sectioned bobbin structure of FIG. 14(a)

In FIG. 14(a), there is shown a side view of a wiring bobbin structure T2 having multiple sections S1–S4 for use in the circuits of FIGS. 12 and 13. FIG. 14(b) is schematic diagram of the bobbin structure T2 of FIG. 14(a). the bobbin structure includes a first narrow section S1 on which is wound the inductor L3, a first wider section S2 on which is wound the inductor L1, a second narrow section S3 on which is wound the inductor L4, and a second wider section S4 on which is wound the inductor L2. The inductors L1,L3 are combined on the same coil and is represented by the tip winding TW in FIG. 14(b). Similarly, the inductors L2,L4 are combined on the coil and is represented by the ring winding RW.

The inventor has designed purposely the bobbin structure T2 to include the narrow section S1(S3) on which is wound the higher frequency of the coil (e.g., inductor L3,L4) since there will be less winding capacitance so as to obtain a maximum useful frequency range. Further, by dividing the bobbin structure into a plurality of sections the beginning of the tip(ring) winding TW(RW) on pin 1 (pin 5) will be farther removed from the end of the tip (ring) winding on pin 4 (pin 8). As result, the interwinding capacitance will be reduce, thereby increasing the useful frequency range of the coil. The first reed switch K1 with pins 2 and 7 is disposed within the center of the bobbin structure T2 so as to be actuable by the windings TW, RW. Further, the second reed switch K2 with pins 3 and 6 may also be formed with the center of the bobbin structure and actuated by the same winding TW, RW.

While the impedance blocking filter circuit 59c of FIG. 9 performs effectively for unconditionally blocking telephone impedances above 20 KHz, the inventor has found that under some conditions transients or voltage spikes will occur which can be fed back into the line side of the telephone equipment, thereby creating momentary interruptions in the ADSL signals in the modem 43 of FIG. 1. These transients are caused by the actuation of the reed switches K1, K2 for switching in the respective capacitors C1, C2.

Figure 15:
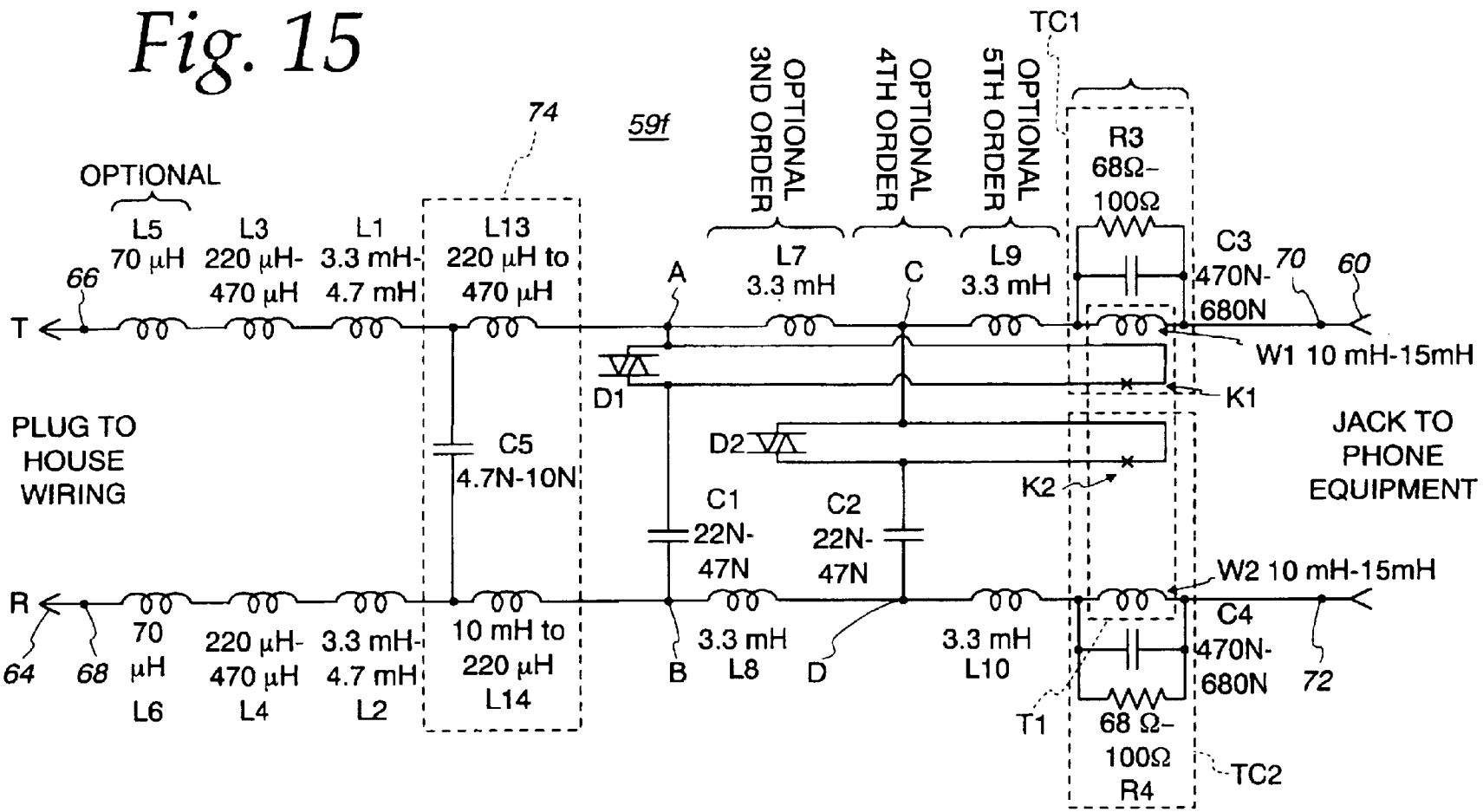
FIG. 15 is a schematic circuit diagram of a seventh embodiment of an impedance blocking filter circuit in accordance with the present invention.

In order to solve this switching transient problem, there is provided in FIG. 15 a seventh embodiment of an impedance blocking filter circuit 59f of the present invention. The seventh embodiment includes all of the circuit elements used in the filter circuit of FIG. 9 and further includes a switch suppression circuit 74 formed of inductors L13, L14 and a capacitor C5. In particular, the inductor L13 is connected in series between the inductor L1 and the common point A. The inductor L14 is connected in series between the inductor L2 and the common point B. The capacitor C5 is connected across the junction of inductors L1, L13 and the junction of inductors L2, L14. It should be noted that the inductors L5 and L6 are optional.

In use, when a telephone set goes "off-hook" DC loop current will flow which creates a DC magnetic field in the first and second inductors W1, W2. This will cause the reed switches K1, K2 of the filter circuit 59f connected to the "off-hook" telephone set to become actuated or closed by the DC magnetic field. As a result, transient spikes will be created. The capacitors C5 of the instant switch suppression circuit 74 will attenuate any voltage spikes that are generated. Further, the inductors L13, l14 serve to limit the maximum current which can flow in the reed switches K1, K2. In this fashion, the voltage spikes are prevented from being fed back into the line side of the phone set, thereby eliminating any potential interruption in the ADSL modem.

Figure 16A:
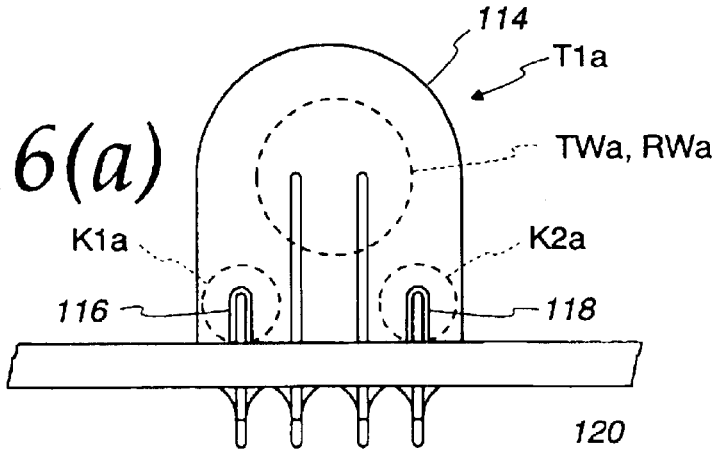
FIG. 16(a) is an end view of an alternate deal winding inductor device housing two reed switches.
Figure 16B:
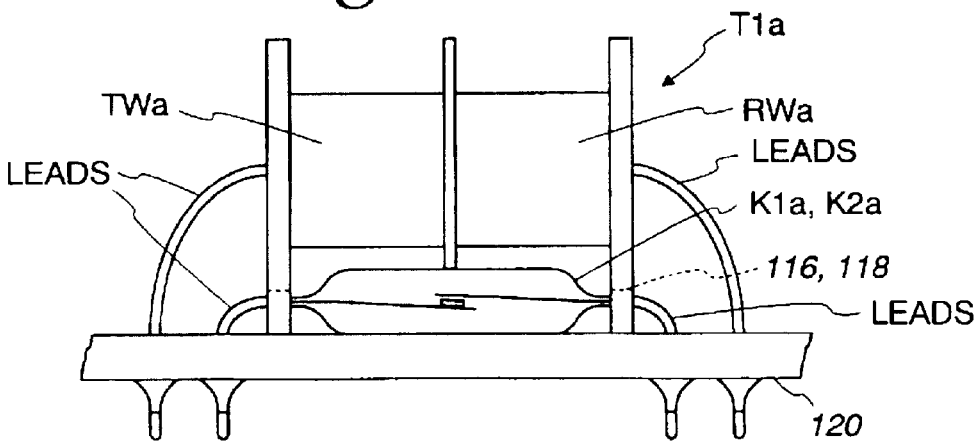
FIG. 16(b) is a side elevational view of the dual winding inductor device of FIG. 16(a)

In FIG. 16(a), there is shown an end view of an alternate dual winding inductor device T1a which may be used instead of the inductor device T1 of FIG. 10(a). FIG. 16(b) is a side elevational view of the dual winding inductor device of FIG. 16(a). As will be noted, the inductor device T1a includes a ferrite core 114 formed of a first winding W1a and a second winding W2a having a pair of reed switch slots 116, 118. Reed switches K1a, K2a are placed initially on a printed circuit board 120. Next, the ferrite core 114 is disposed over the reed switches so that the leads thereof fit into the ferrite slots 116, 118. The leads of the windings and reed switches are then soldered so as to securely retain the inductor device T1a on top of the printed circuit board 120.

Figure 17:
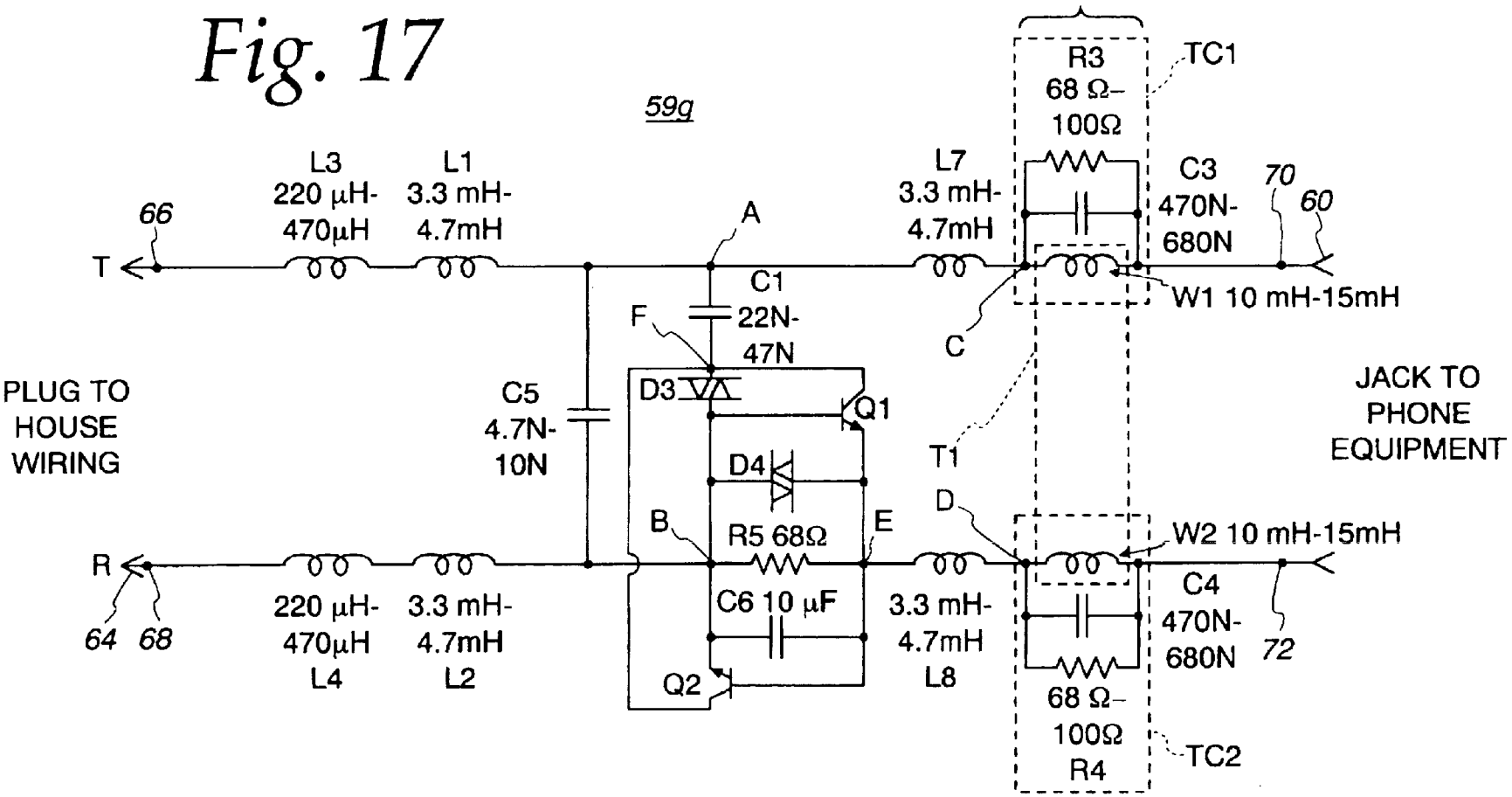
FIG. 17 is a schematic circuit diagram of a eighth embodiment of an impedance blocking filter circuit having transistor switches.

In FIG. 17, there is illustrated an eighth embodiment of an impedance blocking filter circuit 59g of the present invention. The eighth embodiment is substantially identical to the third-order filter circuit of FIG. 9, except that the reed switches K1, K2; capacitors C1, C2; and varistors D1, D2 are replaced with a pair of transistors Q1, Q2; resistor R5; capacitors C1, C5, C6; and metal-oxide or silicon varistors D3, D4. In addition, the inductors L5 and L6 of FIG. 9 have been eliminated.

Specifically, the transistor Q1 has its collector connected to a common point F, its base connected to the common point F via the varistor D3, and its emitter connected to the common point E. The transistor Q2 has its collector also connected to the common point F, its base connected also to the common point E, and its emitter connected to the common point B. The resistor R5 is connected in parallel with the capacitor C6 and is interconnected between the the common points B and E. The varistor D4 is connected between the base and emitter junctions of the transistors Q1 and Q2. The capacitor C6 is connected between the common point A and the common point B. The capacitor C1 is connected between the common points A and F.

In use, when a telephone set goes "off-hook" DC loop current of 20 ma will cause one of the transistors Q1 of Q2 to be rendered conductive dependent upon the direction of the current. The collector of the transistor Q1 or Q2 can actually source or sink current due to the AC ringing and voice band signals. The reverse collector current capacity actually flows through the base-collector junction of the transistor. While the varistor D4 is shown as one device, it should be understood that the same may be formed of two forward-biased diodes disposed in each direction so as to protect the base-emitter junctions of the transistors Q1 and Q2. The varistor D3 also serves to protect the transistors Q1 and Q2 and can have a rating as low as 6–8 volts so as to prevent clamping of audio signals or as high as 200 volts so as to prevent clamping of ringing signals. The capacitor C5 serves to attenuate any voltage spikes that may appear. The resistor R5 is used to set the threshold current for turning on the transistors Q1 and Q2. The capacitor C6 serves to bypass the transistors in order to produce good longitudinal balance and to prevent pulsing during ringing and dialing.

Figure 18:
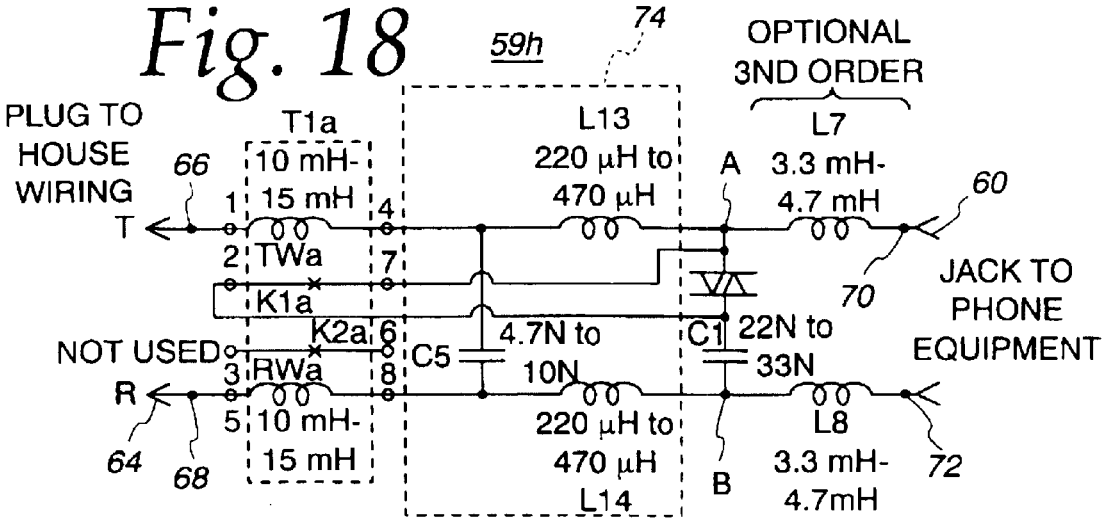
FIG. 18 is a schematic circuit diagram of a ninth embodiment of an impedance blocking filter circuit having a switch suppression circuit.

In FIG. 18, there is also shown a ninth embodiment of an economy impedance filter circuit 59h of the present invention. The ninth embodiment is quite similiar to the fifth embodiment of FIG. 12, except that the dual winding inductor T2 is replaced by the dual winding ferrite core inductor device T1a of FIG. 16(a). Further, the switch suppression circuit 74 of FIG. 15 has also been added. It will be noted that the inductor L13 is interconnected between the inductor winding TWa of the ferrite inductor device T1a and the common point A; the inductor L14 is interconnected between the inductor winding RWa and the common point B; and the capacitor C5 is connected across the inductor windings TWa and RWa. The inductors L5 and L6 of FIG. 12 have also been eliminated. No return loss correction is provided in this simplified filter circuit 59h. It has been found that the filter circuit 59h is more economical to manufacture and assemble, but yet it does switch out the capacitor C1 for on-hook phones thus giving respectful return loss and sidetone. Optionally, an inductor L7 is added between the common point A and the output terminal 70, and an inductor L8 is added between the common point B and the output terminal 72 in order to convert the second-order filter circuit to a third-order filter circuit.

While there has been illustrated and described what is at present considered to be a preferred embodiment of the present invention, it will be understood by those skilled in the art that various changes and modifications may be made, and equivalents may be substituted for elements thereof without department from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

[1. An impedance blocking filter circuit used in telecommunication systems for interconnecting between incoming telephone lines and customer's terminal equipment so as to unconditionally block impedances from above 20 KHz due to the customer's terminal equipment from an ADSL network unit and/or home networking interface unit, said filter circuit comprising:

first and second third inductors connected in series between a first input terminal and a first common point;

said first inductor having its one end connected to said first input terminal and its other end connected to one end of said second inductor, said second inductor having its other end connected to said first common point;

third and fourth inductors connected in series between a second input terminal and a second common point;

said third inductor having its one end connected to said second input terminal and its other end connected to one end of said fourth inductor, said fourth inductor having its other end connected to said second common point;

first switching means having a first end and a second end and being responsive to DC loop current for electrically connecting said first end to said second end;

a first capacitor having a first end connected to said first common point and a second end connected to said first end of said switching means, said second end of said switching means being connected to said second common point;

a fifth inductor having a first end connected to said first common point and a second end connected to a first output terminal, and a sixth inductor having a first end connected to said second common point and a second end connected to a second output terminal;

second switching means having a first end and a second end and being responsive to said DC loop current for electrically connecting said first end to said second end;

a second capacitor having a first end connected to said sixth inductor at a first node and a second end connected to said first end of said second switching means, said second end of said second switching means being connected to said fifth inductor at a second node;

switch suppression circuit means interconnected between said first and second common points for preventing transients caused by actuation of said first and second switching means from being fed back into the incoming telephone lines; and correction circuit means interconnected between said first and second nodes and said output terminals for significantly reducing return loss caused by inductive impedance when the customer's terminal equipment goes off-hook.]

[2. An impedance blocking filter circuit as claimed in claim 1, wherein said correction circuit means is comprised of a first tank circuit and a second tank circuit, said first tank circuit being formed of a first winding inductor, a first tank capacitor, and a first tank resistor all connected in parallel and between said first node and said first output terminal, second tank circuit being formed of a second winding inductor, a second tank capacitor, and a second tank resistor all connected in parallel and between said second node and said second output terminal.]

[3. An impedance blocking filter circuit as claimed in claim 2, further comprising a seventh inductor having a first end connected to said fifth inductor at said first node and a second end connected to said first tank circuit, and an eighth inductor having a first end connected to said sixth inductor at said second node and a second end connected to said second tank circuit.]

[4. An impedance blocking filter circuit as claimed in claim 3, wherein said first switching means includes a first reed switch and said second switching means includes a second reed switch.]

[5. An impedance blocking filter circuit as claimed in claim 4, wherein said first winding of said first tank circuit, said second winding of said second tank circuit, said first reed switch, and said second reed switch are arranged in a dual winding inductor structure.]

[6. An impedance blocking filter circuit as claimed in claim 5, wherein said first winding of said first tank circuit and said first reed switch is arranged in a first current sensor unit, said second winding of said second tank circuit and said second reed switch is arranged in a second current sensor unit.]

[7. An impedance blocking filter circuit as claimed in claim 1, further comprising a first metal-oxide or silicon varistor connected in series with said first capacitor and in parallel with said first switching means, and a second metal-oxide or silicon varistor connected in series with said second capacitor and in parallel with said second switching means.]

[8. An impedance blocking filter circuit as claimed in claim 7, wherein said switch suppression circuit means includes a ninth inductor, a tenth inductor, and a third capacitor.]

[9. An impedance blocking filter circuit as claimed in claim 8, wherein said ninth inductor has a first end connected to said second inductor and a second end connected to said fifth inductor, said tenth inductor has a first end connected to said fourth inductor and a second end connected to said sixth inductor, and said third capacitor has a first end connected to the junction of said second and fifth inductors and a second end connected to the junction of said third and sixth inductors.]

[10. An impedance blocking filter circuit used in telecommunication systems for interconnecting between incoming telephone lines and customer's terminal equipment so as to unconditionally block impedances from above 20 KHz due to the customer's terminal equipment from an ADSL network unit and/or home networking interface unit, said filter circuit comprising:

first and second third inductors connected in series between a first input terminal and a first common point;

said first inductor having its one end connected to said first input terminal and its other end connected to one end of said second inductor, said second inductor having its other end connected to said first common point;

third and fourth inductors connected in series between a second input terminal and a second common point;

said third inductor having its one end connected to said second input terminal and its other end connected to one end of said fourth inductor, said fourth inductor having its other end connected to said second common point;

transistor switching means interconnected between said first and second common points and being responsive to DC loop current for eliminating shunt capacitance caused by other filter circuits connected to on-hook telephone sets;

a fifth inductor having a first end connected to said first common point and a second end connected to a first output terminal, and a sixth inductor having a first end connected to said second common point and a second end connected to a second output terminal; and correction circuit means interconnected between said fifth and sixth inductors and said output terminals for significantly reducing return loss caused by inductive impedance when the customer's terminal equipment goes off-hook.]

[11. An impedance blocking filter circuit as claimed in claim 10, wherein said transistor switching means is comprised of a pair of transistors, a resistor, first and second capacitors, and first and second varistors.]

[12. An impedance blocking filter circuit as claimed in claim 10, wherein said correction circuit means is comprised of a first tank circuit and a second tank circuit, said first tank circuit being formed of a first winding inductor, a first tank capacitor, and a first tank resistor all connected in parallel and between said fifth inductor and said first output terminal, second tank circuit being formed of a second winding inductor, a second tank capacitor, and a second tank resistor all connected in parallel and between said sixth inductor and said second output terminal.]

[13. An impedance blocking filter circuit used in telecommunication systems for interconnecting between incoming telephone lines and customer's terminal equipment so as to unconditionally block impedances from above 20 KHz due to the customer's terminal equipment from an ADSL network unit and/or home networking interface unit, said filter circuit comprising:

first and second third inductors connected in series between a first input terminal and a first common point;

said first inductor having its one end connected to said first input terminal and its other end connected to one end of said second inductor, said second inductor having its other end connected to said first common point;

third and fourth inductors connected in series between a second input terminal and a second common point;

said third inductor having its one end connected to said second input terminal and its other end connected to one end of said fourth inductor, said fourth inductor having its other end connected to said second common point;

first switching means having a first end and a second end and being responsive to DC loop current for electrically connecting said first end to said second end;

a first capacitor having a first end connected to said first common point and a second end connected to said first end of said switching means, said second end of said switching means being connected to said second common point; and switch suppression circuit means interconnected between said first and second common points for preventing transients caused by actuation of said first switching means from being fed back into the incoming telephone lines.]

[14. An impedance blocking filter circuit as claimed in claim 13, further comprising a fifth inductor having a first end connected to said first common point and a second end connected to a first output terminal, and an sixth inductor having a first end connected to said second common point and a second end connected to a second output terminal.]

[15. An impedance blocking filter circuit as claimed in claim 14, wherein said first switching means includes a reed switch.]

[16. An impedance blocking filter circuit as claimed in claim 15, wherein said first through fourth inductors and said reed switch are arranged in a dual winding ferrite core inductor device.]

[17. An impedance blocking filter circuit as claimed in claim 13, further comprising a metal-oxide varistor connected in series with said first capacitor and in parallel with said first switching means.]

*18. A telecommunication impedance blocking filter circuit, comprising:*

*at least one input terminal;*

*at least one output terminal;*

*a first filter stage disposed in electrical series between said at least one input and output terminals;*

*a second filter stage disposed in electrical series with said first filter stage, said second stage comprising a capacitor and switch disposed in series with at least one another;*

*a third filter stage disposed in electrical series with said second filter stage; and*

*a fourth filter stage disposed in electrical series with said third filter stage, said fourth stage being specifically adapted to reduce return loss;*

*wherein at least one of said first through fourth stages comprises a suppression circuit.*

*19. The filter circuit of claim 18, wherein said fourth filter stage is disposed in electrical series between said at least one output terminal and the rest of said first, second and third filter stages within said circuit.*

*20. The filter circuit of claim 19, wherein said fourth stage comprises at least one tank circuit having at least one inductive element and at least one capacitive element disposed in electrical parallel with one another.*

*21. The filter circuit of claim 18, wherein said switch is actuated in response to at least DC loop current.*

*22. The filter circuit of claim 21, wherein said at least DC loop current is generated in response to an off-hook transient.*

*23. The filter circuit of claim 18, wherein said switch comprises a reed switch.*

*24. The filter circuit of claim 18, further comprising a second switch disposed within one of said first, second or third filter stages.*

*25. The filter circuit of claim 18, wherein said suppression circuit is disposed in electrical series with said first, second, and third filter stages.*

*26. The filter circuit of claim 25, wherein said suppression circuit comprises at least one capacitor adapted to attenuate*

*any voltage spikes that are generated due to on-hook or off-hook transients.*

*27. The filter circuit of claim 18, further comprising a suppression circuit disposed within one of said first, second, and third filter stages.*

*28. A telecommunications filter circuit, comprising:*

*first and second input terminals;*

*first and second output terminals;*

*at least first and second inductors disposed in electrical series between said first input and first output terminals;*

*at least third and fourth inductors disposed in electrical series between said second input and second output terminals;*

*at least one switch inductively coupled to at least one of said first and third inductors, said switch disposed in electrical series with at least one capacitor between first and second common points, said common points being in electrical series with said first and second output terminals, respectively; and*

*a suppression circuit coupled between said common points and said input terminals, said suppression circuit being adapted to at least mitigate voltage transients generated through actuation of said at least one switch due to connected equipment transients from being fed back to said input terminals.*

*29. The filter circuit of claim 28, further comprising fifth and sixth inductors disposed in electrical series with said first and second inductors, and third and fourth inductors, respectively, said fifth and sixth inductors being adapted to reduce return loss.*

*30. The filter circuit of claim 29, wherein said fifth and sixth inductors are part of respective ones of tank circuits.*

*31. The filter circuit of claim 30, wherein said at least one switch is actuated in response to at least DC loop current.*

*32. The filter circuit of claim 31, wherein said at least DC loop current is generated in response to an off-hook transient.*

*33. The filter circuit of claim 28, further comprising at least one second switch disposed in electrical parallel with said at least one switch and said at least one capacitor.*

*34. The filter circuit of claim 28, wherein said at least first and third inductors are disposed within respective ones of tank circuits, said tank circuits being disposed in electrical series with said first and second inductors, and said third and fourth inductors, respectively.*

*35. A telecommunication impedance blocking filter circuit, comprising:*

*at least one input terminal;*

*at least one output terminal;*

*a first filter stage disposed in electrical series between said at least one input and output terminals;*

*a second filter stage disposed in electrical series with said first filter stage, said second stage comprising a capacitor and switch disposed in series with at least one another; and*

*a suppression circuit disposed in electrical series with said first and second filter stages, said suppression circuit being adapted to suppress voltage transients occurring within said filter circuit as the result of actuation of said switch during at least one of an on-hook to off-hook, or off-hook to on-hook, transient.*

*36. The filter circuit of claim 35, further comprising a third filter stage having at least first and second tank circuits.*

*37. The filter circuit of claim 35, wherein one of said first and second filter stages comprises at least first and second tank circuits.*

*38. A telecommunications circuit comprising:*

*first and second circuit paths disposed substantially in electrical parallel to one another between respective sets of inputs and output terminals, said first and second circuit paths each comprising a plurality of inductive elements;*

*a capacitor and switch disposed in series with at least one another, said capacitor and switch being disposed electrically between said first and second circuit paths; and*

*a suppression circuit disposed electrically between said first and second circuit paths, said suppression circuit being adapted to suppress voltage transients occurring within said filter circuit as the result of actuation of said switch during at least one of an on-hook to off-hook, or off-hook to on-hook, transient.*

*39. A telecommunication impedance blocking filter circuit, comprising:*

*at least one input terminal;*

*at least one output terminal;*

*a first filter stage disposed in electrical series between said at least one input and output terminals;*

*a second filter stage disposed in electrical series with said first filter stage, said second stage comprising a capacitor and switch disposed in series with at least one another; and*

*a suppression circuit disposed electrically between said at least one input terminal and said second filter stage, said suppression circuit being adapted to at least mitigate voltage transients generated through actuation of said switch from being fed back to said at least one input terminal.*

*40. The filter circuit of claim 39, wherein said circuit is coupled to at least one telecommunications device via said at least one input terminal, and said mitigation of voltage transients prevents interruption of the operation of said at least one device.*

*41. The filter circuit of claim 40, wherein said at least one telecommunications device comprises an ADSL modem.*

*42. The filter circuit of claim 39, further comprising a tank circuit having an inductive element and capacitive element disposed in electrical parallel with one another, said tank circuit being disposed electrically between said second filter stage and said at least one output terminal.*

*43. The filter circuit of claim 39, further comprising a third filter stage disposed in electrical series with said first and second filter stages, said fourth stage being adapted to reduce return loss.*

*44. The filter circuit of claim 42, further comprising a third filter stage disposed in electrical series with said first and second filter stages, said fourth stage being adapted to reduce return loss.*

*45. A telecommunication impedance blocking filter circuit, comprising:*

*a plurality of input terminals;*

*a plurality of output terminals;*

*a first filter stage disposed in electrical series between said at input and output terminals;*

*a second filter stage disposed in electrical series with said first filter stage, said second stage comprising a capacitor and switch disposed in series with at least one another; and*

*a suppression circuit disposed electrically between said first and second filter stages, said suppression circuit being adapted to at least mitigate voltage transients generated through actuation of said switch due to connected equipment transients from being fed back to said input terminals in order to mitigate the effect of said transients on external equipment connected to said input terminals.*

*46. The filter circuit of claim 45, further comprising a tank circuit stage having first and second tank circuits each having an inductive element and capacitive element disposed in electrical parallel with one another, said tank circuit stage being disposed electrically between said second filter stage and said output terminals.*

* * * * *